(12) United States Patent
Sawamoto et al.

(10) Patent No.: US 7,230,329 B2
(45) Date of Patent: Jun. 12, 2007

(54) SEMICONDUCTOR DEVICE, ELECTRONIC DEVICE, ELECTRONIC EQUIPMENT, METHOD OF MANUFACTURING SEMICONDUCTOR DEVICE, AND METHOD OF MANUFACTURING ELECTRONIC DEVICE

(75) Inventors: Toshihiro Sawamoto, Matsumoto (JP); Hirohisa Nakayama, Salzta (JP); Akiyoshi Aoyagi, Atsugi (JP)

(73) Assignee: Seiko Epson Corporation (JP)

( * ) Notice: Subject to any disclaimer, the term of this patent is extended or adjusted under 35 U.S.C. 154(b) by 124 days.

(21) Appl. No.: 10/774,347

(22) Filed: Feb. 6, 2004

(65) Prior Publication Data

US 2004/0222534 A1 Nov. 11, 2004

(30) Foreign Application Priority Data

Feb. 7, 2003 (JP) ............................. 2003-031269

(51) Int. Cl.
- H01L 23/02 (2006.01)
- H01L 23/34 (2006.01)
- H01L 23/48 (2006.01)
- H01L 23/52 (2006.01)
- H01L 29/40 (2006.01)

(52) U.S. Cl. .................. 257/686; 257/685; 257/723; 257/725; 257/777; 257/778

(58) Field of Classification Search ........ 257/685–686, 257/723, 725, 777–778, 776
See application file for complete search history.

(56) References Cited

U.S. PATENT DOCUMENTS

| | | | |
|---|---|---|---|
| 5,120,678 A | 6/1992 | Moore et al. ............... | 291/840 |
| 5,222,014 A | 6/1993 | Lin ............................ | 361/792 |
| 5,608,262 A * | 3/1997 | Degani et al. .............. | 257/723 |
| 5,656,856 A * | 8/1997 | Kweon ....................... | 257/686 |
| 5,677,569 A * | 10/1997 | Choi et al. .................. | 257/686 |
| 5,755,374 A | 5/1998 | Prigmore .................... | 228/183 |
| 5,834,848 A | 11/1998 | Iwasaki ...................... | 257/778 |
| 5,973,392 A | 10/1999 | Senba et al. ................ | 257/686 |
| 6,020,629 A * | 2/2000 | Farnworth et al. ......... | 257/686 |
| 6,023,097 A | 2/2000 | Chiang et al. .............. | 257/700 |
| 6,025,648 A | 2/2000 | Takahashi et al. .......... | 257/778 |
| 6,025,650 A | 2/2000 | Tsuji et al. ................. | 257/786 |

(Continued)

FOREIGN PATENT DOCUMENTS

JP 06-013541 1/1994

(Continued)

OTHER PUBLICATIONS

Communication from Japanese Patent Office re: counterpart application.

(Continued)

*Primary Examiner*—Ida M. Soward
(74) *Attorney, Agent, or Firm*—Harness, Dickey & Pierce, P.L.C.

(57) ABSTRACT

A method is provided to realize a three-dimensional mounting structure of different types of packages. By bonding protruding electrodes onto lands, which are formed on a first carrier substrate, second and third carrier substrates are mounted on the first carrier substrate such that ends of the second and third carrier substrates are arranged above a semiconductor chip.

11 Claims, 10 Drawing Sheets

U.S. PATENT DOCUMENTS

| | | | |
|---|---|---|---|
| 6,034,425 A | 3/2000 | Chiang et al. | 257/697 |
| 6,051,878 A | 4/2000 | Akram et al. | 257/686 |
| 6,121,682 A * | 9/2000 | Kim | 257/723 |
| 6,122,171 A | 9/2000 | Akram et al. | 361/704 |
| 6,229,215 B1 * | 5/2001 | Egawa | 257/777 |
| 6,239,383 B1 | 5/2001 | Lin | 174/260 |
| 6,239,496 B1 * | 5/2001 | Asada | 257/777 |
| 6,288,445 B1 | 9/2001 | Kimura | 257/737 |
| 6,369,444 B1 | 4/2002 | Degani et al. | 257/724 |
| 6,369,448 B1 | 4/2002 | McCormick | 257/777 |
| 6,404,049 B1 | 6/2002 | Shibamoto et al. | 257/712 |
| 6,413,798 B2 * | 7/2002 | Asada | 438/108 |
| 6,414,391 B1 * | 7/2002 | Corisis et al. | 257/738 |
| 6,442,026 B2 | 8/2002 | Yamaoka | 361/704 |
| 6,461,881 B1 | 10/2002 | Farnworth et al. | 438/15 |
| 6,489,678 B1 | 12/2002 | Joshi | 257/723 |
| 6,493,229 B2 | 12/2002 | Akram et al. | 361/704 |
| 6,507,098 B1 | 1/2003 | Lo et al. | 257/686 |
| 6,528,871 B1 | 3/2003 | Tomita | 257/686 |
| 6,564,454 B1 * | 5/2003 | Glenn et al. | 29/852 |
| 6,573,119 B1 | 6/2003 | Hirashima et al. | 438/64 |
| 6,586,832 B2 | 7/2003 | Shibata et al. | 257/710 |
| 6,590,281 B2 * | 7/2003 | Wu et al. | 257/684 |
| 6,590,282 B1 | 7/2003 | Wang et al. | 257/686 |
| 6,600,221 B2 * | 7/2003 | Kimura | 257/686 |
| 6,610,560 B2 * | 8/2003 | Pu et al. | 438/122 |
| 6,611,063 B1 | 8/2003 | Ichinose et al. | 257/784 |
| 6,614,104 B2 * | 9/2003 | Farnworth et al. | 257/686 |
| 6,627,991 B1 | 9/2003 | Joshi | 257/723 |
| 6,710,455 B2 * | 3/2004 | Goller et al. | 257/777 |
| 6,717,244 B1 * | 4/2004 | Hikita et al. | 257/678 |
| 6,717,251 B2 * | 4/2004 | Matsuo et al. | 257/686 |
| 6,727,582 B2 * | 4/2004 | Shibata | 257/723 |
| 6,731,009 B1 | 5/2004 | Jones et al. | 257/777 |
| 6,774,467 B2 | 8/2004 | Horiuchi et al. | 257/673 |
| 6,781,241 B2 | 8/2004 | Nishimura et al. | 257/111 |
| 6,787,916 B2 | 9/2004 | Halahan | 257/777 |
| 6,828,665 B2 * | 12/2004 | Pu et al. | 257/686 |
| 6,833,613 B1 * | 12/2004 | Akram et al. | 257/686 |
| 6,882,232 B2 | 4/2005 | Harima | 257/111 |
| 6,903,458 B1 | 6/2005 | Nathan | 257/737 |
| 6,914,259 B2 * | 7/2005 | Sakiyama et al. | 257/48 |
| 2001/0015488 A1 | 8/2001 | Akram et al. | 257/686 |
| 2001/0026013 A1 * | 10/2001 | Mess et al. | 257/686 |
| 2002/0017709 A1 | 2/2002 | Yanagisawa et al. | 257/686 |
| 2002/0027275 A1 * | 3/2002 | Fujimoto et al. | 257/686 |
| 2002/0079568 A1 | 6/2002 | Degani et al. | 257/686 |
| 2002/0096753 A1 * | 7/2002 | Tu et al. | 257/680 |
| 2002/0163075 A1 * | 11/2002 | Ho et al. | 257/712 |
| 2002/0167079 A1 * | 11/2002 | Pu et al. | 257/685 |
| 2003/0022465 A1 | 1/2003 | Wachtler | 438/462 |
| 2003/0089977 A1 * | 5/2003 | Chee et al. | 257/723 |
| 2003/0127719 A1 * | 7/2003 | Chang | 257/685 |
| 2003/0137041 A1 * | 7/2003 | Blackshear et al. | 257/686 |
| 2003/0141582 A1 * | 7/2003 | Yang et al. | 257/686 |
| 2004/0104469 A1 * | 6/2004 | Yagi et al. | 357/723 |
| 2004/0124520 A1 * | 7/2004 | Rinne | 257/686 |
| 2004/0135243 A1 | 7/2004 | Aoyagi | 257/686 |
| 2004/0212071 A1 * | 10/2004 | Moshayedi | 257/686 |
| 2004/0222510 A1 | 11/2004 | Aoyagi | 257/686 |
| 2004/0238954 A1 | 12/2004 | Miyaji et al. | 257/737 |

FOREIGN PATENT DOCUMENTS

| | | |
|---|---|---|
| JP | 07-183426 | 7/1995 |
| JP | 09-092685 | 4/1997 |
| JP | 09-283697 | 10/1997 |
| JP | 10-084076 | 3/1998 |
| JP | 10-284683 | 10/1998 |
| JP | 10-340928 | 12/1998 |
| JP | 11-307717 | 11/1999 |
| JP | 2000-040713 | 2/2000 |
| JP | 2001-015633 | 1/2001 |
| JP | 2001-44362 | 2/2001 |
| JP | 2001-110979 | 4/2001 |
| JP | 2001-223297 | 8/2001 |
| JP | 2002-057273 | 2/2002 |
| JP | 2002-134661 | 3/2002 |
| JP | 2002-261232 | 9/2002 |
| JP | 2002-329813 | 11/2002 |
| JP | 2002-353272 | 12/2002 |
| JP | 2004-079923 | 3/2004 |
| JP | 2004-265955 | 9/2004 |
| JP | 2004-273938 | 9/2004 |

OTHER PUBLICATIONS

Communication from Japanese Patent Office re: counterpart application.

Communication from Japanese Patent Office regarding counterpart application.

* cited by examiner

SEMICONDUCTOR DEVICE, ELECTRONIC DEVICE, ELECTRONIC EQUIPMENT, METHOD OF MANUFACTURING SEMICONDUCTOR DEVICE, AND METHOD OF MANUFACTURING ELECTRONIC DEVICE

RELATED APPLICATIONS

The present application claims priority to Japanese Patent Application No. 2003-031269 filed Feb. 7, 2003 which is hereby expressly incorporated by reference herein.

BACKGROUND

1. Field of the Invention

The present invention relates to a semiconductor device, an electronic device, electronic equipment, a method of manufacturing the semiconductor device, and a method of manufacturing the electronic device, and particularly is suitable for applying to a stacked structure of semiconductor packages and the like.

2. Description of the Related Art

In a conventional semiconductor device, in order to save space at the time of mounting semiconductor chips, there has been a method of three-dimensionally mounting semiconductor chips while interposing the same type of carrier substrates, as disclosed in Japanese laid-open patent publication No. 10-284683.

However, in the method of three-dimensionally mounting semiconductor chips while interposing the same type of carrier substrates, stacking of different type of packages becomes difficult. As such, there is a problem in that the effectiveness in space savings is not increased because of such difficulty in stacking different types of chips. The present invention is intended to provide a semiconductor device, an electronic device, electronic equipment, a method of manufacturing the semiconductor device, and a method of manufacturing the electronic device, which can realize a three-dimensional mounting structure of different types of packages.

SUMMARY

In order to solve the above-described problem, a semiconductor device according to an embodiment of the present invention includes a first semiconductor package in which a first semiconductor chip is mounted, and a second semiconductor package that is supported on the first semiconductor package such that ends of the second semiconductor package are arranged above the first semiconductor chip.

This enables the second semiconductor package to be stacked on the first semiconductor package in which the first semiconductor package is mounted, even when the size of the first package is different from that of the second semiconductor package. For this reason, a three-dimensional mounting structure and stacking of different types of chips can be realized even when the first package is a different type from that of the second semiconductor package. As such, the effectiveness of space savings can be improved.

Furthermore, a semiconductor device according to an embodiment of the invention further includes a third semiconductor package which is supported on the first semiconductor package such that ends of the third semiconductor package are arranged above the first semiconductor chip. This enables arranging the second semiconductor package and the third semiconductor package on the first semiconductor package, and arranging a plurality of semiconductor packages on the same first semiconductor chip. As such, the mounting area can be further reduced.

Furthermore, as for a semiconductor device according to an embodiment of the invention, the second semiconductor package and the third semiconductor package are separated from each other. Accordingly, even when arranging the second semiconductor package and the third semiconductor package on the first semiconductor package, the heat generated from the first semiconductor chip can be radiated from the gap between the second semiconductor package and the third semiconductor package, and thus the radiation characteristic of the heat generated from the first semiconductor chip can be improved. For this reason, a plurality of semiconductor packages can be arranged above the same first semiconductor chip while suppressing reliability degradation of the first semiconductor chip. As such, the mounting area can be reduced while suppressing functional malfunctioning.

Furthermore, as for a semiconductor device according to an embodiment of the invention, at least one of the size, thickness or material is different between the second semiconductor package and the third semiconductor package. This enables arranging a plurality of different types of packages above the same semiconductor chip, and to cancel out warp produced between the packages, while enabling the further reduction of the mounting area. Thus, the connection reliability between the packages can be improved.

Furthermore, as for a semiconductor device according to an embodiment of the invention, at least one gap selected from the group consisting of: a first gap between the second semiconductor package and the third semiconductor package; a second gap between the first semiconductor package and the second semiconductor package; and a third gap between the first semiconductor package and the third semiconductor package, is filled with resin.

This enables the relief of stress generated in the semiconductor packages due to resin injected between the semiconductor packages. For this reason, the impact resistance of the semiconductor packages can be improved, and thus, even when stacking a plurality of semiconductor packages, the reliability of the semiconductor packages can be ensured. Furthermore, as for a semiconductor device according to an embodiment of the invention, the first semiconductor package includes a first carrier substrate in which the first semiconductor chip is flip-chip mounted, and the second semiconductor package includes a second semiconductor chip, a second carrier substrate in which the second semiconductor chip is mounted, protruding electrodes which are bonded onto the first carrier substrate and which hold the second carrier substrate above the first semiconductor chip, and a sealing agent, which seals the second semiconductor chip.

This enables the stacking of different types of packages while suppressing an increase in height, and the reduction of the mounting area by bonding the protruding electrodes on the first carrier package. Furthermore, as for a semiconductor device according to an embodiment of the invention, the first semiconductor package is a ball grid array in which the first semiconductor chip is flip-chip mounted on the first carrier substrate, and the second semiconductor package is a ball grid array or a chip-size package in which the second semiconductor chip mounted on the second carrier substrate is sealed with a mold.

This enables the stacking of different types of packages even when using general-purpose packages. As such, the mounting area can be reduced while suppressing the degradation of production efficiency. Furthermore, as for a semiconductor device according to an embodiment of the invention, the protruding electrodes are arranged at least at four corners of the second carrier substrate and are excluded from a mounting region of the first semiconductor chip.

This enables stable holding of the second semiconductor package on the first semiconductor package by adjusting the arranged position of the protruding electrodes even when arranging ends of the second semiconductor package above the first semiconductor package. As such, the mounting area can be reduced while suppressing the complication of the stacking structure. Furthermore, as for a semiconductor device according to an embodiment of the invention, the first semiconductor chip may be a logic-processing element and the second semiconductor chip may be a memory element.

This enables the easy realization of various functions and a stacked structure of memory elements as well while suppressing an increase of the mounting area, and thus, memory storage capacity can be increased. Furthermore, a semiconductor device according to an embodiment of the invention includes a first package in which a first semiconductor chip is mounted, and a second semiconductor chip which is supported on the first semiconductor package such that ends of the second semiconductor chip are arranged above the first semiconductor chip.

This enables flip-chip mounting of the second semiconductor chip on the first semiconductor package, such that the second semiconductor chip is arranged on the first semiconductor chip without interposing a carrier substrate between the first semiconductor chip and the second semiconductor chip, even when the types or sizes of the semiconductor chips are different. For this reason, the mounting area can be reduced while suppressing an increase in height at the time of stacking semiconductor chips. As such, the effectiveness in space savings can be improved.

Furthermore, as for a semiconductor device according to an embodiment of the invention, the second semiconductor chip includes a three-dimentional mounting structure. This enables the stacking of a plurality of second semiconductor chips having a different type or size than that of the first semiconductor chip, on the first semiconductor chip, and thus the space savings can be attained at the time of mounting semiconductor chips while enabling various functions.

Furthermore, a semiconductor device according to an embodiment of the invention includes a first package in which an electronic component is mounted, and a second package which is supported on the first package such that ends of the second package are arranged above the electronic component. This enables the realization of a three-dimensional mounting structure even when the first package is a different type than the second package. Thus, the effectiveness in space savings can be improved because the stacking of different types of components can be attained.

Furthermore, a semiconductor device according to an embodiment of the invention includes a first semiconductor package in which a semiconductor chip is mounted, a second semiconductor package which is supported on the first semiconductor package such that ends of the second semiconductor package are arranged above the semiconductor chip, and a motherboard on which the second semiconductor package is mounted. This enables to realize a three-dimensional mounting structure of different types of packages in which semiconductor chips are mounted, and thus miniaturizing and weight saving of electronic equipment can be attained, while enabling the improvement of functional characteristics of electronic equipment.

Furthermore, a method of manufacturing a semiconductor device according to an embodiment of the invention includes a step which mounts a first semiconductor chip on a first carrier substrate, a step which mounts a second semiconductor chip on a second carrier substrate, a step which forms first protruding electrodes on the second carrier substrate, and a step which bonds the first protruding electrodes on the first carrier substrate such that ends of the second carrier substrate are arranged above the first semiconductor chip.

This enables the stacking of the second carrier substrate on the first carrier substrate in which the first semiconductor chip is mounted, by bonding the first protruding electrodes onto the first carrier substrate, even when the sizes of the first carrier substrate and the second carrier substrate are different. For this reason, stacking of different types of chips can be attained by adjusting the arranged position of the first protruding electrodes, thereby enabling the improvement of the effectiveness in space savings, while suppressing the complication of the manufacturing steps.

Furthermore, a method of manufacturing a semiconductor device according to an embodiment of the invention includes a step which mounts a third semiconductor chip on a third carrier substrate, a step which forms second protruding electrodes on the third carrier substrate, and a step which bonds the second protruding electrodes on the first carrier substrate such that ends of the third carrier substrate are arranged above the first semiconductor chip.

This enables arranging a plurality of semiconductor packages above the same semiconductor chip by adjusting the arranged position of the first protruding electrodes and the second protruding electrodes. As such, a further reduction of the mounting area becomes possible while suppressing the complication of the manufacturing steps. Furthermore, a method of manufacturing a semiconductor device according to an embodiment of the invention further includes a step which injects resin into at least one gap selected from the group consisting of: a first gap between the second carrier substrate and the third carrier substrate; a second gap between the first carrier substrate and the second carrier substrate; and a third gap between the first carrier substrate and the third carrier substrate.

This enables the efficient injection of the resin into gaps between the semiconductor packages, and thus the gaps between the semiconductors can be narrowed. For this reason, the mounting density of the semiconductor packages can be improved while improving the impact resistance of the semiconductor packages, and thus the mounting area can be reduced, while ensuring the reliability of the semiconductor packages.

Furthermore, a method of manufacturing a semiconductor device according to an embodiment of the invention further includes a step which seals the second carrier substrate in which the second semiconductor chip is mounted, with a first sealing agent, a step which seals the third carrier substrate in which the third semiconductor chip is mounted, with a second sealing agent, a step which makes the surface of the first sealing agent and the surface of the second sealing agent contact a flat surface in a condition of having the first sealing agent and the second sealing agent separated; and a step which fills the gap between the first sealing agent and the second sealing agent with resin by injecting resin from the formation surface side of the first protruding electrodes and the second protruding electrodes.

This enables the planarization of the top surface of the semiconductor package, which is arranged at the upper stage, even when the second carrier substrate and the third carrier substrate, which are mounted on the first substrate, are separated from each other. For this reason, a stable picking up of the semiconductor package with an absorption pad becomes possible, thereby enabling the precise mounting of the semiconductor packages on a motherboard.

Furthermore, a method of manufacturing an electronic device according to an embodiment of the invention includes a step which mounts a first electronic component on a first carrier substrate, a step which mounts a second electronic component on a second carrier substrate, a step which forms protruding electrodes on the second carrier substrate, and a step which bonds the protruding electrodes onto the first carrier substrate such that ends of the second carrier substrate are arranged above the first electronic component.

This enables the arrangement of the second electronic component on the first semiconductor component by adjusting the arranged position of the protruding electrodes, and thus a reduction of the mounting area becomes possible, while suppressing the complication of the manufacturing steps.

DETAILED DESCRIPTION

Figure 1:
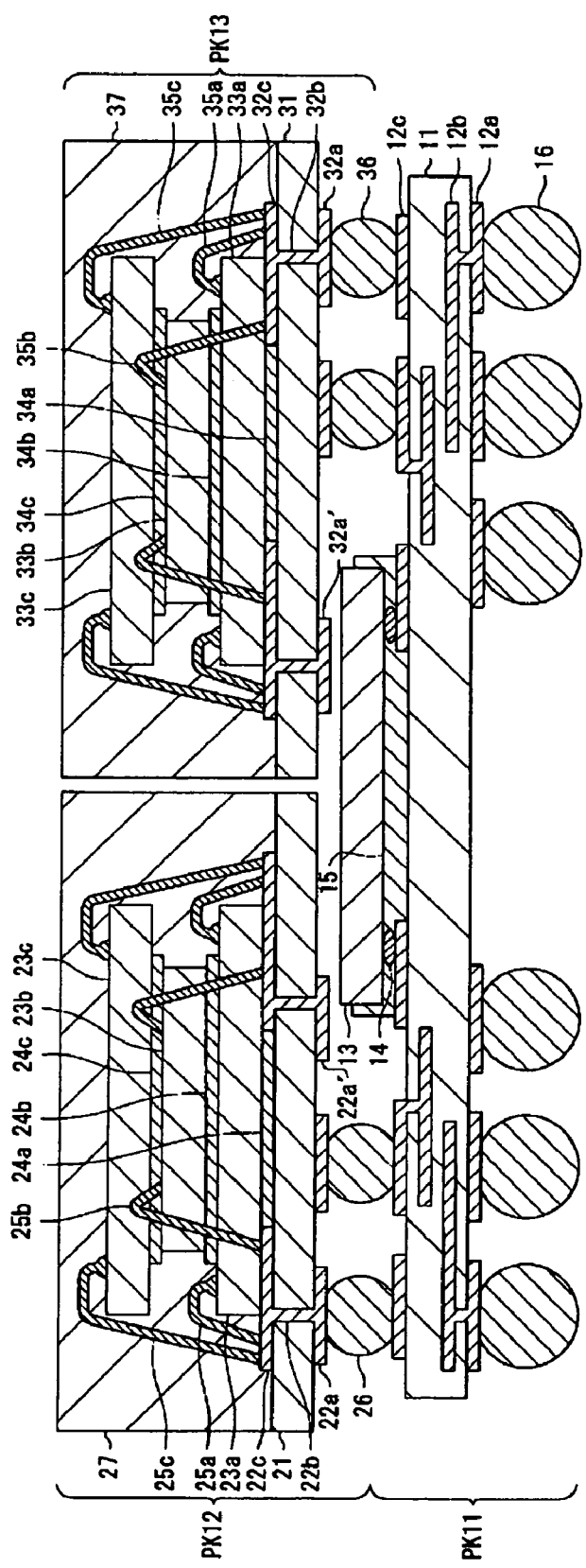
FIG. 1 is a sectional view showing a structure of a semiconductor device according to a first embodiment.
Figure 2:
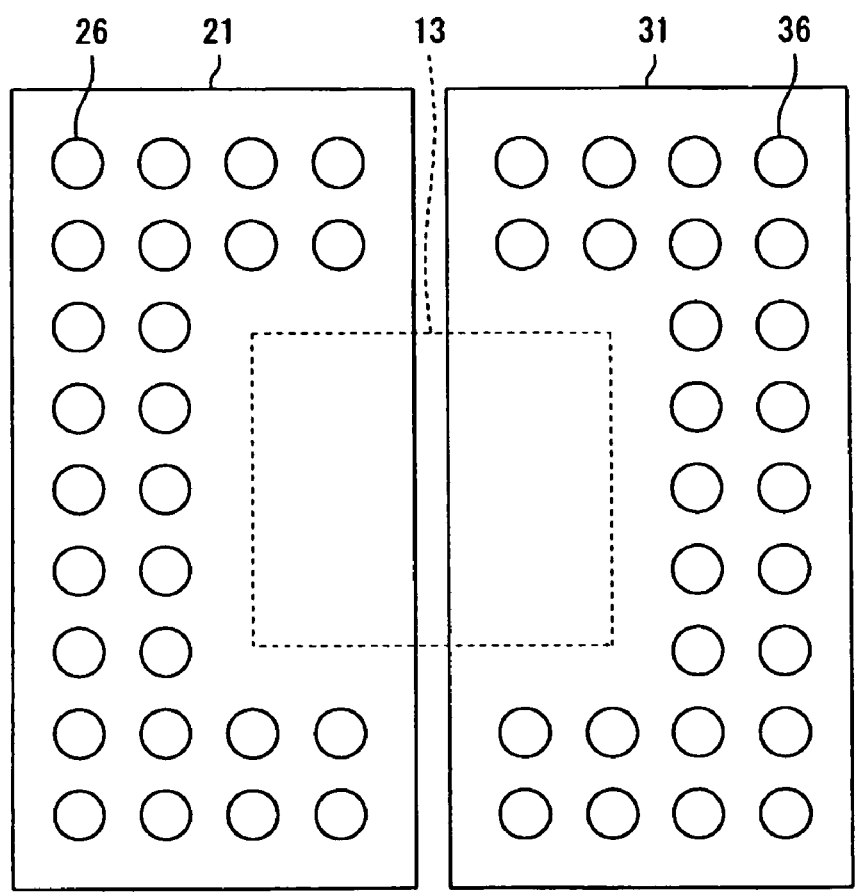
FIG. 2 is a plan view showing a configuration according to the first embodiment.

Hereinafter, semiconductor devices, electronic devices and methods of manufacturing the same according to embodiments of the present invention will be described with reference to drawings. FIG. 1 is a sectional view showing a structure of a semiconductor device according to a first embodiment of the invention, and FIG. 2 is a plan view showing a structure of the semiconductor device according to the first embodiment of the invention. In addition, according to the first embodiment, a semiconductor package PK12 in which semiconductor chips (or semiconductor die) 23a-23c of a stacked-structure are wire-bonded, and a semiconductor package PK13 in which semiconductor chips (or semiconductor die) 33a-33c of a stacked-structure are wire-bonded, are stacked on a semiconductor package PK11 in which a semiconductor chip (or semiconductor die) 13 is mounted by using ACF (Anisotropic Conductive Film) bonding.

In FIG. 1, the semiconductor package PK11 has a carrier substrate 11 provided therein, and lands 12a and 12c are formed on both sides of the carrier substrate 11. Internal wirings 12b are formed inside the carrier substrate 11. Then, on the carrier substrate 11, the semiconductor chip 13 is flip-chip mounted, and protruding electrodes 14 for flip-chip mounting are formed on the semiconductor chip 13. Then, the protruding electrodes 14, which are formed on the semiconductor chip 13, are ACF bonded onto the lands 12c via an anisotropic conductive sheet 15. Protruding electrodes 16 for mounting the carrier substrate 11 on a motherboard are formed on the lands 12a which are formed on the back surface of the carrier substrate 11.

By mounting the semiconductor chip 13 on the carrier substrate 11 by using ACF bonding, the space for wire bonding and mold sealing becomes unnecessary. Thus, this enables the attainment of space savings at the time of three-dimensional mounting, while enabling the temperature to be lowered when bonding the semiconductor chip 13 onto the carrier substrate 11, and thus warping of the carrier substrate 11 in actual use can be reduced.

On the other hand, the semiconductor packages PK12 and PK13 have carrier substrates 21 and 31 provided therein, respectively. While lands 22a, 22a', 32a, and 32a' are formed on the back surfaces of the carrier substrates 21 and 31, respectively, lands 22c and 32c are formed on the top surface of the carrier substrates 21 and 31, respectively, and furthermore internal wirings 22b and 32b are formed inside the carrier substrate 21 and 31, respectively. Here, on the lands 22a and 32a, protruding electrodes 26 and 36 are arranged, respectively, while the lands 22a' and 32a' can be left without the protruding electrodes 26 and 36 arranged thereon.

Then, on the carrier substrates 21 and 31, while semiconductor chips 23a and 33a are face-up mounted respectively via respective adhesion layers 24a and 34a, the semiconductor chips 23a and 33a are wire-bonded to the lands 22c and 32c via respective conductive wires 25a and 35a. Furthermore, on the semiconductor chips 23a and 33a, semiconductor chips 23b and 33b are face-up mounted respectively, while avoiding the conductive wires 25a and 35a. Furthermore, the semiconductor chips 23b and 33b are secured, respectively, onto the semiconductor chip 23a and 33a via respective adhesion layers 24b and 34b, while being wire-bonded to the lands 22c and 32c via respective conductive wires 25b and 35b. Furthermore, on the semiconductor chips 23b and 33b, semiconductor chips 23c and 33c are face-up mounted respectively, while avoiding the conductive wires 25b and 35b. Then the semiconductor chips 23c and 33c are secured, respectively, onto the semiconductor chip 23b and 33b via respective adhesion layers 24c and 34c, while being wire-bonded onto the lands 22c and 32c via respective conductive wires 25c and 35c.

Moreover, on the lands 22a and 32a formed on the back surfaces of the respective carrier substrates 21 and 31, protruding electrodes 26 and 36, which mount the carrier substrates 21 and 31 respectively on the carrier substrate 11, are formed such that the carrier substrates 21 and 31 are held above the semiconductor chip 13. Here, the protruding electrodes 26 and 36 preferably exist at least at the four corners of the carrier substrates 21 and 31. For example, as shown in FIG. 2, the protruding electrodes 26 and 36 may be arranged in a U-shape.

This enables the stable holding of the carrier substrates 21 and 31 on the carrier substrate 11, even when the carrier substrates 21 and 31 are mounted on the carrier substrate 11, such that ends of the carrier substrates 21 and 31 are arranged above the semiconductor chip 13. Moreover, adjustment of the arranged position of the protruding electrodes 26 and 36 becomes possible by having lands 22a' and 32a', which are left without the protruding electrodes 26 and 36 arranged thereon, provided on the carrier substrates 21 and 31, respectively. For this reason, even when the type and size of the semiconductor chip 13, which is to be mounted on the carrier substrate 11, are changed, the protruding electrodes 26 and 36 can be re-arranged without changing the structures of the carrier substrates 21 and 31. As such, a general-purpose use of the carrier substrates 21 and 31 can be attained.

By bonding the protruding electrodes 26 and 36 onto the lands 12c, which are provided on the carrier substrate 11, the carrier substrates 21 and 31 can be mounted on the carrier substrate 11 such that ends of the carrier substrates 21 and 31 are arranged above the semiconductor chip 13. This enables arranging a plurality of semiconductor packages PK12 and PK13 on the same semiconductor chip 13, thereby a three-dimensional mounting of different types of semiconductor chips 13, 23a-23c and 33a-33c can be attained, while enabling to the reduction of the mounting area.

Here, as for the semiconductor chip 13, for example, a logic-processing element such as a CPU, and as for the semiconductor chips 23a-23c and 33a-33c, for example, memory elements such as DRAM, SRAM, EEPROM and a flash memory can be used. This enables the realization of various functions, while suppressing an increase of the mounting area, and furthermore to easily realize a stacked structure of memory elements, thereby the storage capacity can be easily increased.

In addition, when mounting the carrier substrates 21 and 31 on the carrier substrate 11, the back surfaces of the carrier substrates 21 and 31 may be closely contacted onto the semiconductor chip 13, or the back surfaces of the carrier substrates 21 and 31 may be separated from the semiconductor chip 13. Moreover, the side walls of the carrier substrate 21 and the carrier substrate 31 may closely contact each other or they may be separated from each other. Here, by having the side walls of the carrier substrate 21 and the carrier substrate 31 closely contacted, the packaging density of the semiconductor packages PK12 and PK13 which are to be mounted on the semiconductor package PK11 can be improved, thereby attaining space savings. On the other hand, by separating the side walls of the carrier substrate 21 and the carrier substrate 31 from each other, the radiation of heat generated from the semiconductor chip 13 through the gap between the semiconductor packages PK12 and PK13 becomes possible. As such, the radiation characteristic of the heat generated from the semiconductor chip 13 can be improved.

Moreover, sealing resin 27 and 37 is provided over the whole surface of the carrier substrates 21 and 31, respectively, on the mounting side of the semiconductor chips 23a-23c and 33a-33c, and thus the semiconductor chips 23a-23c and 33a-33c are sealed with resin 27 and 37, respectively. In addition, when sealing the semiconductor chips 23a-23c and 33a-33c by the sealing resin 27 and 37, respectively, molding which uses a thermosetting resin, such as an epoxy resin, can be carried out.

In addition, as for the carrier substrates 11, 21, and 31, for example, a double-sided substrate, a multilayer-interconnection substrate, a build-up substrate, a tape substrate, or a film substrate, can be used. As for the material of the carrier substrates 11, 21 and 31, for example, a polyimide resin, a glass epoxy resin, BT resin, a composite of aramid and epoxy, or a ceramic, can be used. Moreover, as for the protruding electrodes 16, 26 and 36, for example, an Au bump, Cu bump or Ni bump covered with solder material or the like, or a solder ball, can be used, and furthermore as for the conductive wires 25a-25c and 35a-35c, for example, Au wire, and aluminum wire, can be used. Moreover, in the above-described embodiment, in order to mount the carrier substrates 21 and 31 on the carrier substrate 11, although a method of forming the protruding electrodes 26 and 36 on the respective lands 22a and 32a of the carrier substrates 21 and 31, has been described, the protruding electrodes 26 and 36 may be formed on the lands 12c of the carrier substrate 11.

Moreover, in the above-described embodiment, although a method of mounting the semiconductor chip 13 on the carrier substrate 11 by using ACF bonding has been described, other adhesive bonding, for example, such as NCF (Nonconductive Film) may be used, or a metal bonding such as solder bonding and alloy bonding may be used. Moreover, although a method of using wire bonding has been described, when mounting the semiconductor chips 23a-23c, and 33a-33c on the carrier substrates 21 and 31, respectively, the semiconductor chips 23a-23c, and 33a-33c may be flip-chip mounted onto the carrier substrates 21 and 31, respectively. Furthermore, in the above-described embodiment, although a method of mounting only one semiconductor chip 13 on the carrier substrate 11 has been described as an example, a plurality of semiconductor chips may be mounted on the carrier substrate 11.

FIGS. 3(a)-(d) are sectional views showing a method of manufacturing a semiconductor device according to a second embodiment of the invention. In addition, according to the second embodiment, resin 65 is injected into the gap between semiconductor packages PK22 and PK23, which are mounted on a semiconductor package PK21 such that ends of the semiconductor packages PK22 and PK23 overlap above a semiconductor chip 43, the gap between semiconductor packages PK21 and PK22, and the gap between semiconductor packages PK21 and PK23.

Figure 3A:
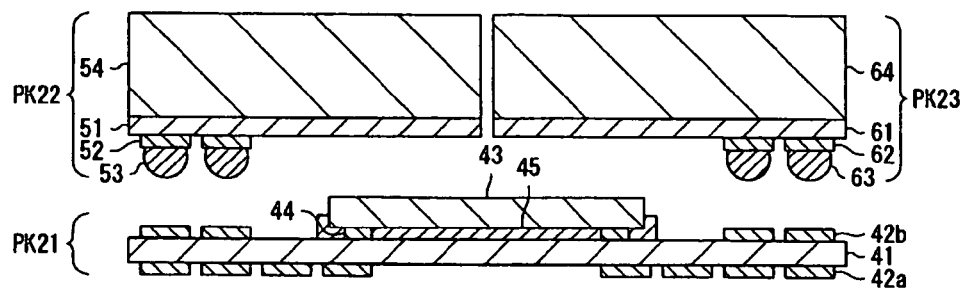
FIGS. 3(a)-(d) are sectional views showing a manufacturing method according to a second embodiment.

In FIG. 3(a), the semiconductor package PK21 has a carrier substrate 41 provided therein, and lands 42a and 42b are formed on both sides of the carrier substrate 41. Then, on the carrier substrate 41, the semiconductor chip 43 is flip-chip mounted, and furthermore protruding electrodes 44 for flip-chip mounting are formed on the semiconductor chip 43. Then, the protruding electrodes 44, which are formed on the semiconductor chip 43, are ACF bonded onto lands 42b via an anisotropic conductive sheet 45.

On the other hand, semiconductor packages PK22 and PK23 have carrier substrates 51 and 61 provided therein, respectively, and lands 52 and 62 are formed on the back surfaces of the carrier substrates 51 and 61, respectively, and protruding electrodes 53 and 63, such as solder balls, are formed on the lands 52 and 62, respectively. Moreover, on the carrier substrates 51 and 61, semiconductor chips are mounted, and the whole surface of the carrier substrates 51 and 61 in which the semiconductor chips are mounted, is sealed by sealing resin 54 and 64, respectively. In addition, on the carrier substrate 51 and 61, semiconductor chips, which are wire bonded, may be mounted, or the semiconductor chips may be flip-chip mounted, or a stacked structure of the semiconductor chips may be mounted.

Figure 3B:
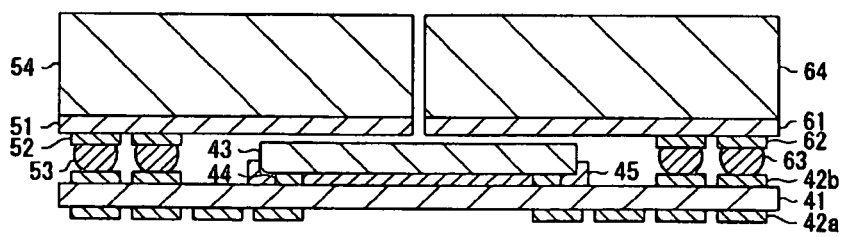

Then, when stacking the semiconductor packages PK22 and PK23 on the semiconductor package PK21, a flux or soldering paste is applied to the lands 42b of the carrier substrate 41. Next, as shown in FIG. 3(b), by mounting the semiconductor packages PK22 and PK23, which are separated from each other, onto the semiconductor package PK21, and by carrying out reflow processing, the protruding electrodes 53 and 63 are bonded onto the lands 42b.

This enables arranging the plurality of semiconductor packages PK22 and PK23 above the same semiconductor chip 43 by adjusting the arranged position of the protruding electrode 53 and 63, which are to be arranged on the carrier substrates 51 and 61. Thus, a reduction of the mounting area becomes possible, while preventing the complication of the manufacturing steps. Moreover, by stacking the semiconductor packages PK22 and PK23 on the semiconductor package PK21, sorting out and mounting only inspection-finished good semiconductor packages PK21, PK22, and PK23 becomes possible, thereby the manufacturing yield can be increased.

Figure 3C:
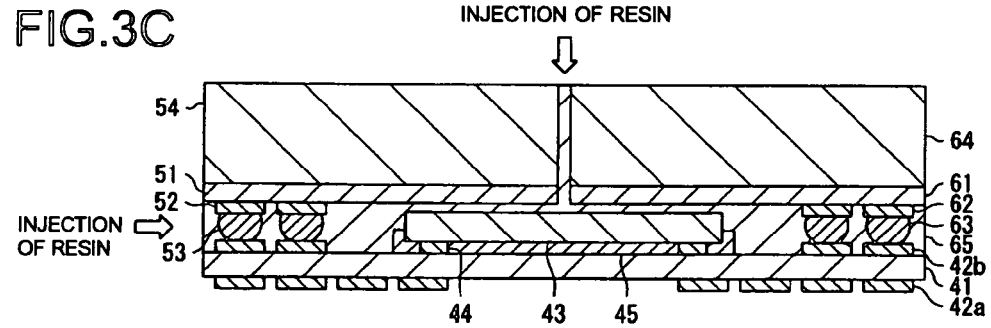

Next, as shown in FIG. 3(c), the gap between the semiconductor packages PK21, PK22, and PK23 is filled with resin 65 by injecting the resin 65 into the gap between the semiconductor packages PK21, PK22, and PK23. Here, when filling the gap between semiconductor packages PK21, PK22, and PK23 with the resin 65, the resin 65 can be injected into any gap including: the gap between the semiconductor package PK21 and the semiconductor package PK22; the gap between the semiconductor package PK21 and the semiconductor package PK23; or the gap between the semiconductor package PK22 and the semiconductor package PK23.

This enables efficiently filling the gap between the semiconductor packages PK21, PK22, and PK23 with the resin 65, and thus the impact resistance of the semiconductor packages PK21, PK22, and PK23 can be improved. For this reason, even when residual stress concentrates on the root of the protruding electrodes 53 and 63, cracking can be prevented from being induced on the protruding electrodes 53 and 63, and thus the reliability of the semiconductor packages PK21, PK22, and PK23 can be improved.

Figure 3D:
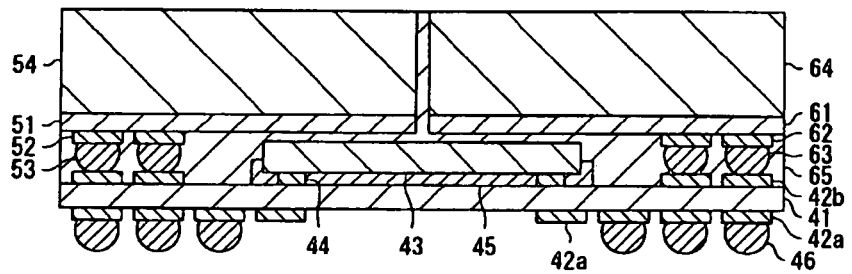

Next, as shown in FIG. 3(d), protruding electrodes 46 for mounting a carrier substrate 41 on a motherboard are formed on the lands 42a, which are formed on the back surface of the carrier substrate 41.

FIGS. 4(a)-(d) are sectional views showing a method of manufacturing a semiconductor device according to a third embodiment of the invention. In addition, according to the third embodiment, semiconductor packages PK32 and PK33 in which protruding electrodes 83 and 93 are formed, are arranged separately and upside down in a container 85 having a flat bottom, and then resin 95 is injected from the formation surface side of the protruding electrodes 83 and 93 into the gap between the semiconductor packages PK32 and PK33.

In FIG. 4, a semiconductor package PK31 has a carrier substrate 71 therein, and lands 72a and 72b are formed on both sides of the carrier substrate 71. Then, on the carrier substrate 71, a semiconductor chip 73 is flip-chip mounted, and protruding electrodes 74 for flip-chip mounting are formed on the semiconductor chip 73. Then, protruding electrodes 74 formed on the semiconductor chip 73 are ACF bonded onto the lands 72b via an anisotropic conductive sheet 75.

On the other hand, the semiconductor packages PK32 and PK33 have carrier substrates 81 and 91 provided therein, respectively, and lands 82 and 92 are formed on the back surfaces of the carrier substrates 81 and 91, respectively, and the protruding electrodes 83 and 93, such as solder balls, are formed on the lands 82 and 92, respectively. Moreover, on the carrier substrates 81 and 91, semiconductor chips are mounted, and the whole surface of the carrier substrates 81 and 91 in which the semiconductor chips are mounted, is sealed with sealing resin 84 and 94, respectively.

Figure 4A:
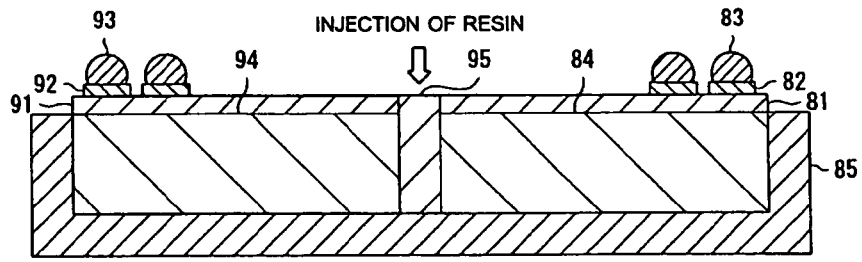
FIGS. 4(a)-(d) are sectional views showing a manufacturing method according to a third embodiment.

Then, as shown in FIG. 4(a), the semiconductor packages PK32 and PK33 in which the protruding electrodes 83 and 93 are arranged, are arranged separately and upside down, in the container 85 having a flat bottom. Then, resin 95 is injected from the formation surface side of the protruding electrodes 83 and 93 into the gap between semiconductor packages PK32 and PK33, and then the resin 95 is cured. In addition, a cast having a flat bottom may be used instead of the container 85.

Figure 4B:
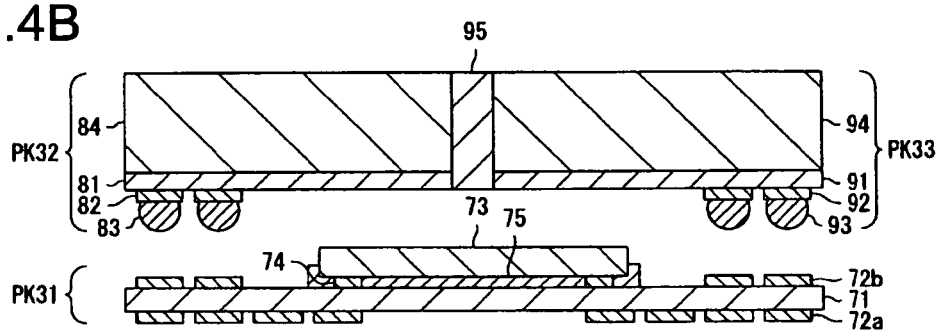
Figure 4C:
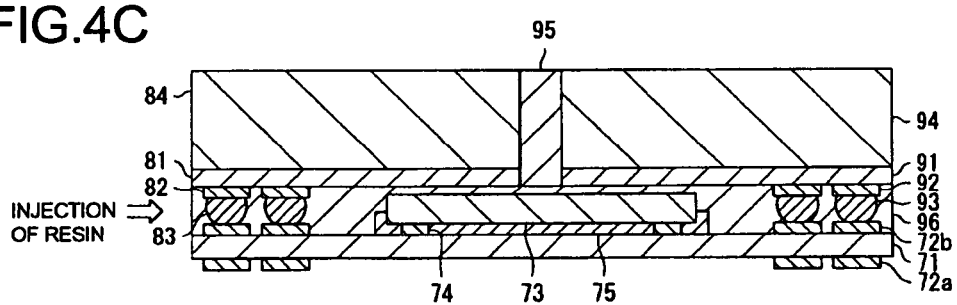

Next, as shown in FIG. 4(b) and FIG. 4(c), after the resin 95 has been injected into the gap between the semiconductor packages PK32 and PK33, the semiconductor packages PK32 and PK33 filled with the resin 95 are taken out from the container 85. Then, the protruding electrodes 83 and 93 are bonded onto the lands 72b by mounting the semiconductor packages PK32 and PK33, which are filled with the resin 95, onto the semiconductor package PK31 and by carrying out reflow processing. Then, the gap between the semiconductor packages PK31, PK32, and PK33 is filled with resin 96 by injecting the resin 96 through the gap between the semiconductor packages PK31, PK32, and PK33 from the side thereof.

Figure 4D:
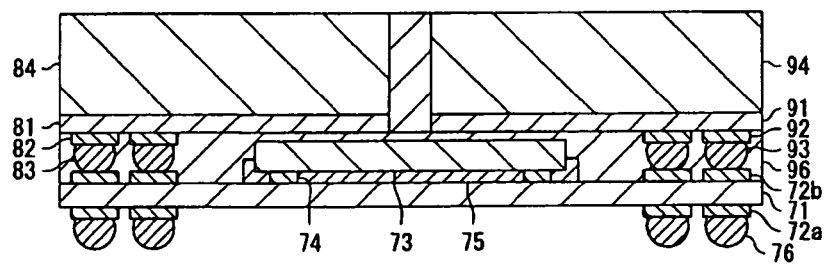

Next, as shown in FIG. 4(d), protruding electrodes 76 for mounting the carrier substrate 71 on a motherboard are formed on the lands 72a, which are formed on the back surface of the carrier substrate 71. This enables the planarization of the top surface of the semiconductor packages PK32 and PK33, even when the semiconductor packages PK32 and PK33 are mounted on the semiconductor package PK31 while being separated from each other. For this reason, stably picking up the mounting structure of the semiconductor packages PK31, PK32, and PK33 becomes possible by using an absorption pad, thereby enabling mounting of the mounting structure of the semiconductor packages PK31, PK32, and PK33 on the motherboard with sufficient accuracy.

In addition, according to the embodiment of FIG. 4, although a method of filling the gap between the semiconductor packages PK32 and PK33 with the resin 95 after having formed the protruding electrodes 83 and 93 on the packages PK32 and PK33 respectively, has been described, the protruding electrodes 83 and 93 may be formed on the packages PK32 and PK33 respectively after filling the gap between the semiconductor packages PK32 and PK33 with the resin 95.

Figure 5:
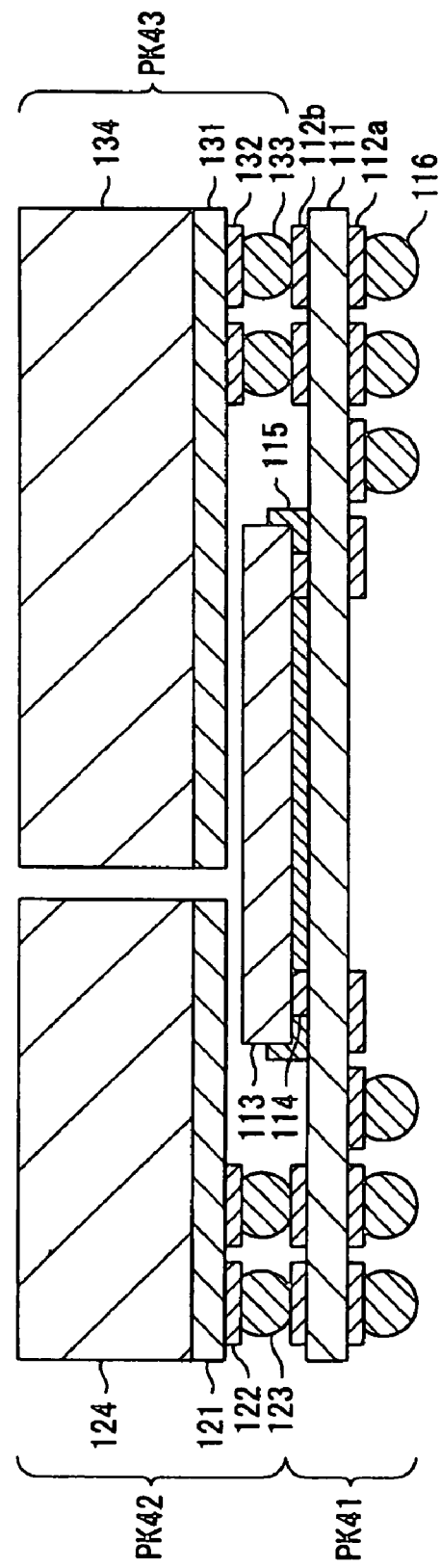
FIG. 5 is a sectional view showing a structure of a semiconductor device according to a fourth embodiment.

FIG. 5 is a sectional view showing a method of manufacturing a semiconductor device according to a fourth embodiment of the invention. In addition, according to the fourth embodiment, a plurality of different size semiconductor packages PK42 and PK43 are mounted on a semiconductor package PK41. In FIG. 5, the semiconductor package PK41 has a carrier substrate 111 provided therein, and lands 112a and 112b are formed on both sides of the carrier substrate 111. Then, on the carrier substrate 111, a semiconductor chip 113 is flip-chip mounted, and protruding electrodes 114 for flip-chip mounting are formed on the semiconductor chip 113. Then, the protruding electrodes 114 formed on the semiconductor chip 113 are ACF bonded onto lands 112b via an anisotropic conductive sheet 115.

On the other hand, the semiconductor packages PK42 and PK43 have carrier substrates 121 and 131, which sizes differ mutually, provided therein, respectively, and lands 122 and 132 are formed on the back surfaces of the carrier substrates 121 and 131, respectively, and furthermore the protruding electrodes 123 and 133, such as solder balls, are formed on the lands 122 and 132, respectively. Moreover, the semiconductor chips are mounted on the carrier substrates 121 and 131, and the whole surface of the carrier substrates 121 and 131 in which the semiconductor chips are mounted, is sealed by sealing resin 124 and 134, respectively.

By bonding the protruding electrodes 123 and 133 onto the lands 112b, which are formed on the carrier substrate 111, a plurality of semiconductor packages PK42 and PK43, which sizes differ mutually, are mounted on the semiconductor package PK41, such that ends of the carrier substrates 121 and 131 are arranged above the semiconductor chip 113.

While this enables arranging the semiconductor packages PK42 and PK43 in which different types of chips are mounted, on the same semiconductor chip 113, and the reduction of the mounting area, and canceling out the warp produced between the semiconductor packages PK41, PK42, and PK43 becomes possible, thereby enabling the improvement of the connection reliability between the semiconductor packages PK41, PK42, and PK43.

In addition, in the embodiment of FIG. 5, although a method of mounting the plurality of semiconductor packages PK42 and PK43, which sizes differ mutually, on the semiconductor package PK41, has been described, semiconductor packages in which thickness, material, or sizes differ mutually, can be mounted on the semiconductor package PK41. Moreover, as for each of the semiconductor packages PK42 and PK43 mounted on the semiconductor package PK41, the arranged position, the arranged pitch, the number of arranged rows, or the arranging method (for example, a grid arrangement or a staggered arrangement) and the like of the protruding electrodes may be changed.

Figure 6:
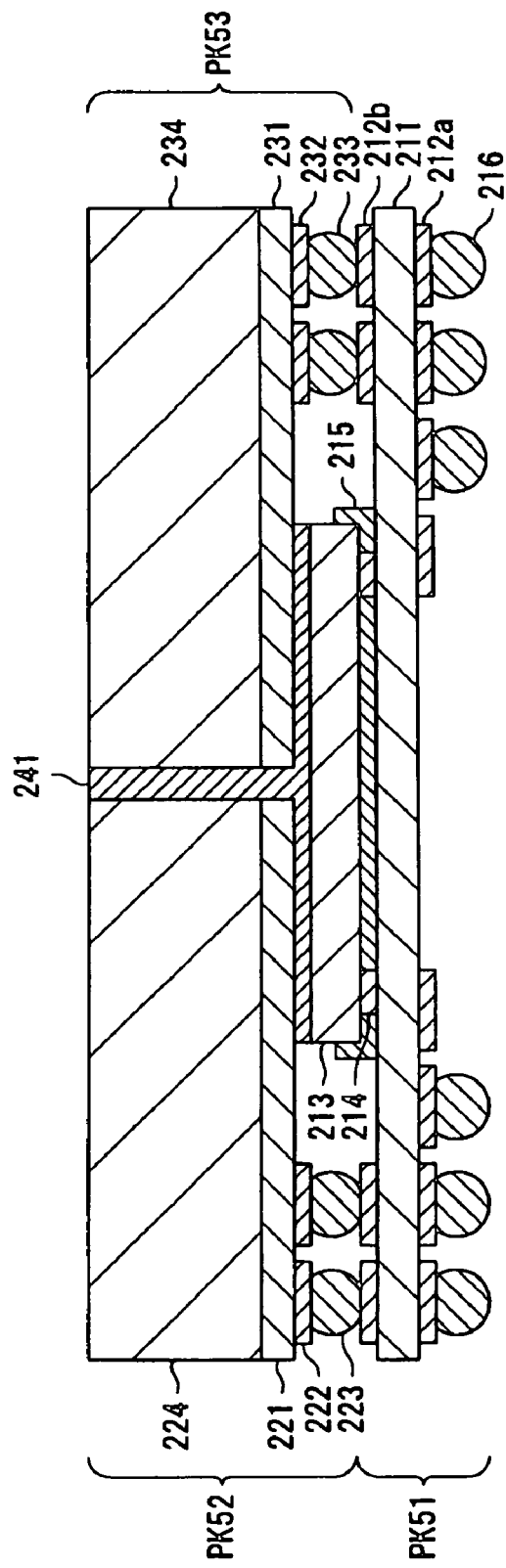
FIG. 6 is a sectional view showing a structure of a semiconductor device according to a fifth embodiment.

FIG. 6 is a sectional view showing a structure of a semiconductor device according to a fifth embodiment of the invention. In addition, according to the fifth embodiment, resin 241 is injected into the gap between semiconductor packages PK52 and PK53, which are mounted on a semiconductor package PK51, such that ends of the semiconductor packages PK52 and PK53 overlap a semiconductor chip 213. In FIG. 6, the semiconductor package PK51 has a carrier substrate 211 provided therein, and lands 212a and 212b are formed on both sides of the carrier substrate 211. Then, on the carrier substrate 211, the semiconductor chip 213 is flip-chip mounted, and protruding electrodes 214 for flip-chip mounting are formed on the semiconductor chip 213. Then, the protruding electrodes 214 formed in the semiconductor chip 213 are ACF bonded onto the lands 212b via an anisotropic conductive sheet 215.

On the other hand, the semiconductor packages PK52 and PK53 have the carrier substrates 221 and 231 provided therein, respectively, and lands 222 and 232 are formed on the back surfaces of the carrier substrates 221 and 231, respectively. Then the protruding electrodes 223 and 233, such as solder balls, are formed on lands 222 and 232, respectively. Moreover, semiconductor chips are mounted on the carrier substrates 221 and 231, and the whole surface of the carrier substrates 221 and 231 in which the semiconductor chips are mounted, is sealed by sealing resin 224 and 234, respectively.

Then, by bonding the electrodes 223 and 233 onto the lands 212b formed on the carrier substrate 211, the plurality of semiconductor packages PK52 and PK53 are mounted on the semiconductor package PK51 such that ends of the carrier substrates 221 and 231 are arranged above the semiconductor chip 213. Moreover, the gap between the semiconductor packages PK52 and PK53, which are mounted on the semiconductor package PK51, is filled with resin 241. This enables for the resin 241 to absorb the stress applied to the semiconductor packages PK52 and PK53, and thus the reliability of the semiconductor packages PK52 and PK53 can be improved.

In addition, when filling the gap between semiconductor packages PK52 and PK53 with the resin 241, the resin 241 may overflow into the gap between the semiconductor packages PK52, PK53, and the semiconductor chip 213. This enables supporting of the other ends of the semiconductor packages PK52 and PK53 via the resin 241, even when the protruding electrodes 223 and 233 are arranged only at one end of semiconductor packages PK52 and PK53, respectively. As such, a stable mounting of the semiconductor packages PK52 and PK53 on the semiconductor package PK51 becomes possible.

Figure 7:
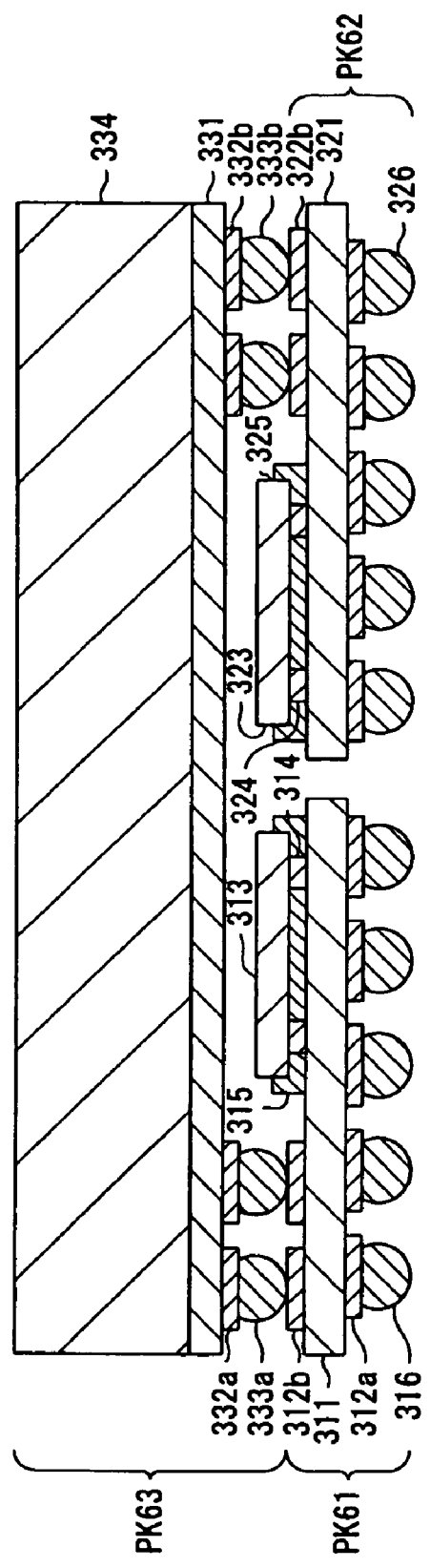
FIG. 7 is a sectional view showing a structure of a semiconductor device according to a sixth embodiment.

FIG. 7 is a sectional view showing a structure of a semiconductor device according to a sixth embodiment of the invention. In addition, according to the sixth embodiment, lower-stage semiconductor packages PK61 and PK62, on which a semiconductor package PK63 is mounted, are divided. In FIG. 7, the semiconductor packages PK61 and PK62 have the carrier substrates 311 and 321 provided therein, respectively, and while lands 312a and 322a are formed on the back surfaces of the carrier substrates 311 and 321, respectively, lands 312b and 322b are formed on the top surface of the carrier substrates 311 and 321, respectively. Then, on the carrier substrates 311 and 321, semiconductor chips 313 and 323 are flip-chip mounted, respectively, and the protruding electrodes 314 and 324 for flip-chip mounting are formed on the semiconductor chips 313 and 323, respectively. Then, the protruding electrodes 314 and 324 formed on the semiconductor chips 313 and 323 are ACF bonded onto the lands 312b and 322b respectively, via an anisotropic conductive sheets 315 and 325, respectively.

On the other hand, a semiconductor package PK63 has a carrier substrate 331 provided therein, and lands 332a and 332b are formed on the back surface of the carrier substrate 331, and then protruding electrodes 333a and 333b, such as solder balls, are formed on the lands 332a and 332b, respectively. Moreover, a semiconductor chip is mounted on the carrier substrate 331, and the whole surface of the carrier substrate 331 in which the semiconductor chip is mounted, is sealed by sealing resin 334.

Then, by bonding the protruding electrodes 333a and 333b onto the lands 312b and 322b formed on the carrier substrates 311 and 321, respectively, the semiconductor package PK63 is mounted on the semiconductor packages PK61 and PK62 such that the carrier substrate 331 is arranged above the semiconductor chips 313 and 323. This enables arranging the same semiconductor package PK63 on the plurality of semiconductor packages PK61 and PK62, thus a three-dimensional mounting of different types of chips becomes possible, while enabling the reduction of the mounting area.

Figure 8:
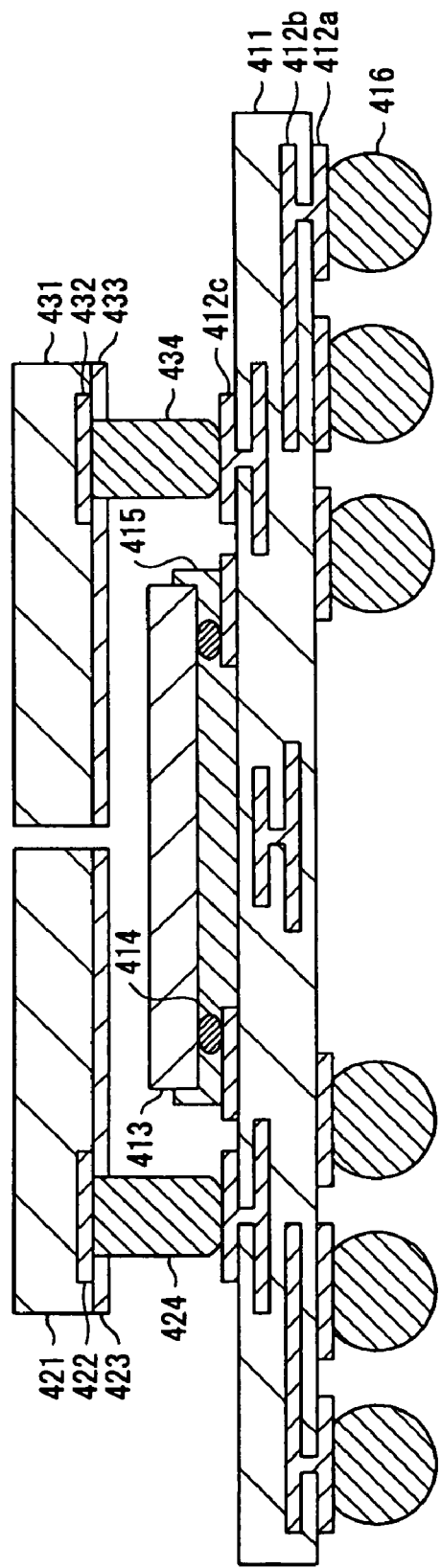
FIG. 8 is a sectional view showing a structure of a semiconductor device according to a seventh embodiment.

FIG. 8 is a sectional view showing a structure of a semiconductor device according to a seventh embodiment of the invention. In addition, according to the seventh embodiment, semiconductor chips 413, 421, and 431 are flip-chip mounted on a carrier substrate 411, such that ends of the semiconductor chips 421 and 431 are arranged above the semiconductor chip 413.

In FIG. 8, while lands 412a and 412c are formed on both sides of the carrier substrate 411, internal wirings 412b are formed inside the carrier substrate 411. Then, on the carrier substrate 411, the semiconductor chip 413 is flip-chip mounted, and protruding electrodes 414 for flip-chip mounting are formed on the semiconductor chip 413. Then, the protruding electrodes 414, which are formed on the semiconductor chip 413, are ACF bonded onto lands 412c via an anisotropic conductive sheet 415. In addition, when mounting the semiconductor chip 413 on the carrier substrate 411, besides a method of using ACF bonding, other adhesive bonding, such as NCF bonding may be used, or a metal bonding such as solder bonding and alloy bonding, may be used. Moreover, on the lands 412a formed on the back surface of the carrier substrate 411, protruding electrodes 416 for mounting the carrier substrate 411 on a motherboard are formed.

On the other hand, on the semiconductor chips 421 and 431, while electrode pads 422 and 432 are formed respectively, insulating layers 423 and 433 are formed such that the electrode pads 422 and 432 are exposed. Then, on the electrode pads 422 and 433, protruding electrodes 424 and 434 for flip-chip mounting the semiconductor chips 421 and 431 are formed, respectively, such that ends of the semiconductor chips 421 and 431 are held above the semiconductor chip 413.

Here, the protruding electrodes 424 and 434 can be arranged, but are excluded from a mounting region of the semiconductor chip 413, and for example, the protruding electrodes 424 and 434 can be arranged in a U-shape. Then, the semiconductor chips 421 and 431 are flip-chip mounted on the carrier substrate 411 such that the protruding electrodes 424 and 434 are bonded onto the lands 412c formed on the carrier substrate 411, and ends of the semiconductor chips 421 and 431 are arranged above the semiconductor chip 413.

This enables flip-chip mounting of the semiconductor chips 421 and 431 above the semiconductor chip 413 without interposing carrier substrates between the semiconductor chips 413, 421 and 431, even when the types or sizes of the semiconductor chips 413, 421, and 431 are different. For this reason, the mounting area can be reduced, while suppressing an increase in height at the time of stacking the semiconductor chips 413, 421 and 431, thereby the effectiveness in space savings can be improved.

In addition, when mounting the semiconductor chips 421 and 431 on the carrier substrate 411, the semiconductor chips 421 and 431 may be closely contacted onto the semiconductor chip 413, or the semiconductor chips 421 and 431 may be separated from the semiconductor chip 413. Moreover, when mounting the semiconductor chips 421 and 431 on the carrier substrate 411, an adhesive bonding such as ACF bonding and NCF bonding, may be used, or a metal bonding such as solder bonding and alloy bonding, may be used. Moreover, as for the protruding electrodes 414, 416, 424 and 434, for example, an Au bump, Cu bump or Ni bump covered with solder material, or a solder ball, may be used. Moreover, the gap between the semiconductor chips 421, 431 and the carrier substrate 411 can be filled with sealing resin.

Figure 9:
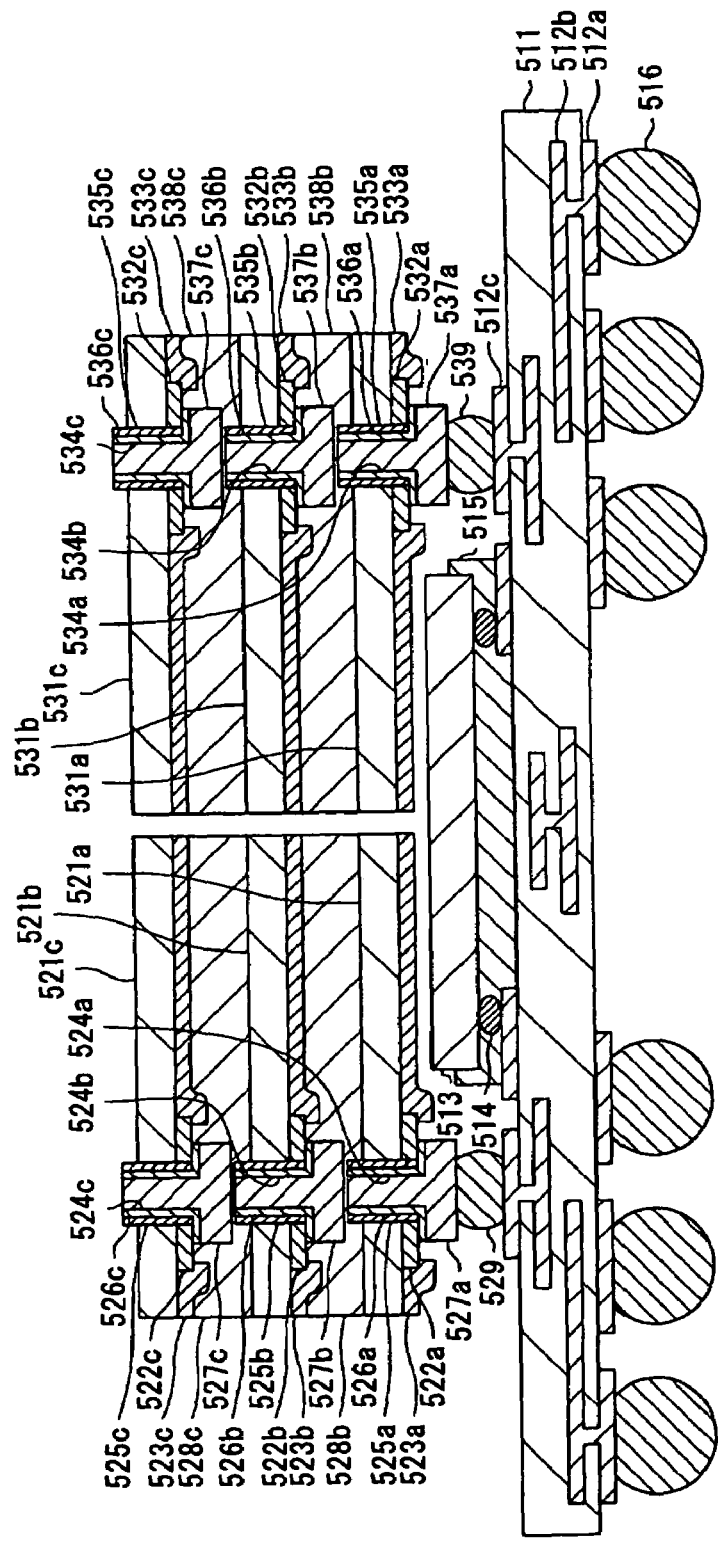
FIG. 9 is a sectional view showing a structure of a semiconductor device according to an eighth embodiment.

FIG. 9 is a sectional view showing a structure of a semiconductor device according to an eighth embodiment of the invention. In addition, according to the eighth embodiment, semiconductor chips of a stacked structure 521a-521c and 531a-531c are flip-chip mounted on a carrier substrate 511 such that ends of the semiconductor chips of a stacked structure 521a-521c and 531a-531c are arranged above a semiconductor chip 513.

In FIG. 9, while lands 512a and 512c are formed on both sides of the carrier substrate 511, internal wirings 512b are formed inside the carrier substrate 511. Then, on the carrier substrate 511, the semiconductor chip 513 is flip-chip mounted, and protruding electrodes 514 for flip-chip mounting are formed on the semiconductor chip 513. Then, the protruding electrodes 514, which are formed on the semiconductor chip 513, are ACF bonded onto lands 512c via an anisotropic conductive sheet 515. In addition, when mounting the semiconductor chip 513 on the carrier substrate 511, besides a method of using ACF bonding, other adhesive bonding, such as NCF bonding, may be used, or a metal bonding, such as solder bonding and alloy bonding, may be used. Moreover, on the lands 512a formed on the back surface of the carrier substrate 511, protruding electrodes 516 for mounting the carrier substrate 511 on a motherboard are formed.

On the other hand, on the semiconductor chips 521a-521c and 531a-531c, while electrode pads 522a-522c and 532a-532c are formed, respectively, insulating layers 523a-523c and 533a-533c are formed such that each of the electrode pads 522a-522c and 532a-532c are exposed. Then, in the semiconductor chips 521a-521c and 531a-531c, for example, through-holes 524a-524c and 534a-534c are formed corresponding to the positions of each of the electrode pads 522a-522c and 532a-532c, respectively. Then, inside each of the through-holes 524a-524c and 534a-534c, through-hole electrodes 527a-527c and 537a-537c are formed, respectively, via insulating layers 525a-525c and 535a-535c and via conductive films 526a-326c and 536a-536c, respectively. Then, the semiconductor chips 521a-521c and 531a-531c in which the through-hole electrodes 527a-527c and 537a-537c are formed, respectively, are stacked via the through-hole electrodes 527a-527c and 537a-537c, respectively. Furthermore, resin 528a, 528b, 538a, and 538b are injected into the gap between the semiconductor chips 521a-521c and 531a-531c.

Then, on each of the through-hole electrodes 527a and 537a, which are formed on the semiconductor chips 521a and 531a respectively, protruding electrodes 529 and 539 for flip-chip mounting the stacked structures of the semiconductor chips 521a-521c and 531a-531c are formed, such that ends of the stacked structures of the semiconductor chips 521a-521c and 531a-531c are held above the semiconductor chip 513.

Here, the protruding electrodes 529 and 539 can be arranged, but are excluded from a mounting region of the semiconductor chip 513, and for example, the protruding electrodes 529 and 539 can be arranged in a U-shape. Then, the protruding electrodes 529 and 539 are bonded onto the lands 512c, which are formed on the carrier substrate 511, and thus the semiconductor chips 521a-521c and 531a-531c of a stacked structure are flip-chip mounted on the carrier substrate 511 such that ends of the semiconductor chips 521a-521c and 531a-531c of a stacked structure are arranged above the semiconductor chip 513.

This enables flip-chip mounting of the stacked structures of the semiconductor chips 521a-521c and 531a-531c on the semiconductor chip 513 without interposing carrier substrates between the stacked structures of the semiconductor chips 521a-521c, 531a-531c and the semiconductor chip 513, and thus a stacking of the plurality of semiconductor chips 521a-521c and 531a-531c, of different types from that of the semiconductor chip 513, becomes possible, while suppressing an increase in height at the time of stacking.

Moreover, when mounting the stacked structures of the semiconductor chips 521a-521c and 531a-531c on the carrier substrate 511, for example, an adhesive bonding such as ACF bonding and NCF bonding, may be used, or a metal bonding such as solder bonding and alloy bonding, may be used. Moreover, as for the protruding electrodes 514, 516, 529 and 539, for example, an Au. bump, Cu bump or Ni bump covered with solder material, or a solder ball, may be used. Moreover, although in the embodiment mentioned above, a method of mounting a three-layer structure of semiconductor chips 521a-521c and 531a-531c on the carrier substrate 511 has been described, a stacked structure of the semiconductor chips, which are mounted on the carrier substrate 511, may be two layers or four layers or more. Moreover, the gaps between semiconductor chips 521a, 531a and the carrier substrate 511 may be filled with sealing resin.

Figure 10:
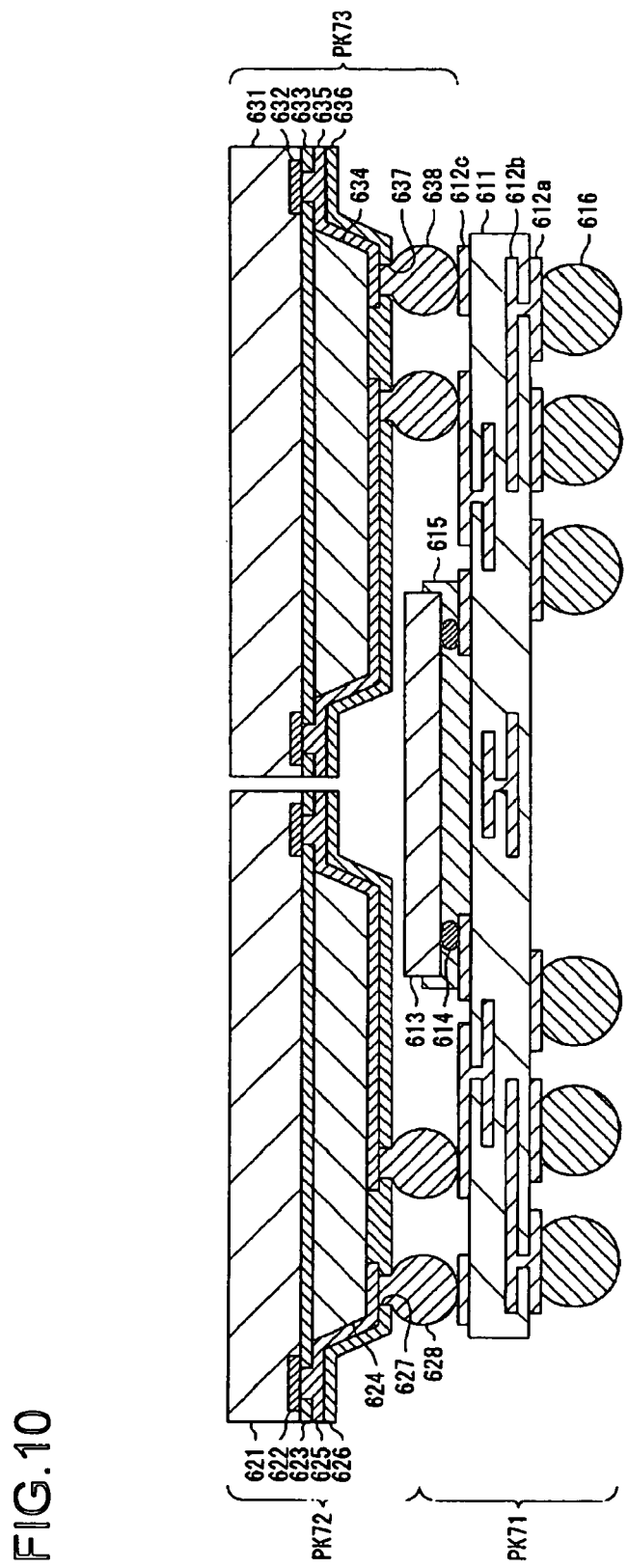
FIG. 10 is a sectional view showing a structure of a semiconductor device according to a ninth embodiment.

FIG. 10 is a sectional view showing a structure of a semiconductor device according to a ninth embodiment of the invention. In addition, according to the ninth embodiment, a plurality of W-CSPs (wafer level-chip-size packages) are mounted on a carrier substrate 611, such that ends of the W-CSPs are arranged above a semiconductor chip 613. In FIG. 10, a semiconductor package PK71 has the carrier substrate 611 provided therein, and lands 612a and 612c are formed on both sides of the carrier substrate 611, while internal wirings 612b are formed inside the carrier substrate 611. Then, on the carrier substrate 611, the semiconductor chip 613 is flip-chip mounted, and protruding electrodes 614 for flip-chip mounting are formed on the semiconductor chip 613. Then, protruding electrodes 614, which are formed on the semiconductor chip 613, are ACF bonded onto lands 612c via an anisotropic conductive sheet 615. Moreover, on the lands 612a formed on the back surface of the carrier substrate 611, protruding electrodes 616 for mounting the carrier substrate 611 on a motherboard are formed.

On the other hand, semiconductor packages PK72 and PK73 have semiconductor chips 621 and 631 provided therein, respectively, and on each of the semiconductor chips 621 and 631, electrode pads 622 and 632 are formed, respectively, while insulating layers 623 and 633 are formed, respectively, such that each of the electrode pads 622 and 632 is exposed. Then, on each of the semiconductor chips 621 and 631, stress relieving layers 624 and 634 are formed, respectively, such that each of the electrode pads 622 and 632 is exposed. Furthermore, on each of the electrode pads 622 and 632, re-routing wirings 625 and 635, which are extended on the stress relieving layers 624 and 634 respectively, are formed. Then, on each of the re-routing wirings 625 and 635, solder-resist films 626 and 636 are formed, respectively, and on each of the solder-resist films 626 and 636, openings 627 and 637, which expose the re-routing wirings 625 and 635 on each of the stress relieving layers 624 and 634 respectively, are formed. Then, on the re-routing wirings 625 and 635, which are exposed via each of the openings 627 and 637 respectively, protruding electrodes 628 and 638 for face-down mounting each of the semiconductor chips 621 and 631 on the carrier substrate 611 are formed such that ends of semiconductor chips 621 and 631 are held above the semiconductor chip 613.

Here, the protruding electrodes 628 and 638 can be arranged, but are excluded from a mounting region of the semiconductor chip 613, and for example, the protruding electrodes 628 and 638 can be arranged in a U-shape. Then, the semiconductor packages PK72 and PK73 are mounted on the carrier substrate 611 such that the protruding electrodes 628 and 638 are bonded to the lands 612c, which are formed on the carrier substrate 611, and furthermore ends of the semiconductor chips 6211 and 631 are arranged above the semiconductor chip 613.

Accordingly, the W-CSPs can be stacked on the carrier substrate 611 in which the semiconductor chip 613 is flip-chip mounted, and thus even when the types or sizes of the semiconductor chips 613, 621 and 631 are different, the semiconductor chips 621 and 631 can be three-dimensionally mounted on the semiconductor chip 613 without interposing carrier substrates between the semiconductor chips 613, 621 and 631. For this reason, the mounting area can be reduced, while suppressing an increase in height at the time of stacking the semiconductor chips 613, 621 and 631, thereby improving the effectiveness in space savings.

In addition, when mounting the semiconductor packages PK72 and PK73 on the carrier substrate 611, the semiconductor packages PK72 and PK73 may be closely contacted onto the semiconductor chip 613, or the semiconductor packages PK72 and PK73 may be separated from the semiconductor chip 613. Moreover, when mounting the semiconductor packages PK72 and PK73 on the carrier substrate 611, an adhesive bonding such as ACF bonding and NCF bonding, may be used, or a metal bonding such as solder bonding and alloy bonding, may be used. Moreover, as for the protruding electrodes 614, 616, 628, and 638, for example, an Au bump, Cu bump or Ni bump covered with solder material, or a solder ball, may be used.

In addition, the above-described semiconductor devices and the electronic devices are applicable to electronic equipment such as a liquid crystal display, a cellular phone, a Personal Digital Assistant, a video camera, a digital camera and MD (Mini Disc) player, and thus enable the attainment of weight savings and miniaturization of electronic equipment, while improving the functional performance of electronic equipment. Moreover, although in the above-described embodiments, methods of mounting semiconductor chips or semiconductor packages have been described as examples, the present invention is not necessarily limited to the methods of mounting semiconductor chips or semiconductor packages, and, for example, a ceramic element such as a surface acoustic wave (SAW) element, an optical device such as a light modulator and an optical switch, and various sensors such as a magnetic sensor and a bio-sensor, may be mounted.

What is claimed is:

1. A semiconductor device, comprising:
    a first semiconductor package in which a first semiconductor chip is mounted, the first semiconductor chip mounted on a top surface of a first carrier substrate of the first semiconductor package;
    a second semiconductor package in which at least one semiconductor chip is mounted and is supported on the first semiconductor package such that ends of the second semiconductor package are arranged above the first semiconductor chip; and
    a third semiconductor package that is supported on the first semiconductor package such that ends of the third semiconductor package are arranged above the first semiconductor chip;
    wherein the second semiconductor package and the third semiconductor package are separated from each other.

2. The semiconductor device according to claim 1, wherein at least one of a size, thickness and material is different between the second semiconductor package and the third semiconductor package.

3. The semiconductor device according to claim 1, wherein at least one gap selected from the group including:
    a gap between the second semiconductor package and the third semiconductor package;
    a gap between the first semiconductor package and the second semiconductor package; and
    a gap between the first semiconductor package and the third semiconductor package;
    is filled with resin.

4. The semiconductor device according to claim 1, wherein:
the first semiconductor chip is flip-chip mounted on the first carrier substrate;
the second semiconductor chip is mounted on a second carrier substrate;
protruding electrodes are bonded onto the first carrier substrate and hold the second carrier substrate above the first semiconductor chip; and
a sealing agent, which seals the second semiconductor chip.

5. The semiconductor device according to claim 4, wherein the first semiconductor packages is a ball grid array in which the first semiconductor chip is flip-chip mounted on the first carrier package, and the second semiconductor package is one of a ball grid array and a chip-size package in which the second semiconductor chip mounted on the second carrier substrate is sealed with a mold.

6. The semiconductor device according to claim 4, wherein the protruding electrodes are arranged at least at four corners of the second carrier substrate, and are excluded from a mounting region of the first semiconductor chip.

7. The semiconductor device according to claim 4, wherein the first semiconductor chip is a logic-processing element, and the second semiconductor chip is a memory element.

8. A semiconductor device, comprising:
a first semiconductor package in which a first semiconductor chip is mounted, the first semiconductor chip mounted on a top surface of a first carrier substrate of the first semiconductor package;
a second semiconductor package having a second semiconductor chip that is supported on the first semiconductor package such that ends of the second semiconductor chip are arranged above the first semiconductor chip; and
a third semiconductor package having a third semiconductor chip that is supported on the first semiconductor package such that ends of the third semiconductor chip are arranged above the first semiconductor chip;
wherein the second semiconductor package and the third semiconductor package are separated from each other.

9. The semiconductor device according to claim 8, wherein the second semiconductor chip includes a three-dimensional mounting structure.

10. An electronic device, comprising:
a first package in which an electronic component is mounted on a top surface of a first carrier substrate of the first semiconductor package;
a second package that is supported on the first package such that ends of the second package are arranged above the electronic component; and
a third package that is supported on the first package such that ends of the third package are arranged above the electronic component;
wherein the second package and the third package are separated from each other.

11. Electronic equipment, comprising:
a first semiconductor package in which a semiconductor chip is mounted on a top surface of a first carrier substrate of the first semiconductor package;
a second semiconductor package that is supported on the first semiconductor package such that ends of the second semiconductor package are arranged above the semiconductor chip;
a motherboard on which the second semiconductor package is mounted; and
a third semiconductor package that is supported on the first semiconductor package such that ends of the third semiconductor package are arranged above the semiconductor chip;
wherein the second semiconductor package and the third semiconductor package are separated from each other.

* * * * *